(12) United States Patent
Dokken et al.

(10) Patent No.: US 8,615,691 B2
(45) Date of Patent: Dec. 24, 2013

(54) PROCESS FOR IMPROVING DESIGN-LIMITED YIELD BY LOCALIZING POTENTIAL FAULTS FROM PRODUCTION TEST DATA

(75) Inventors: Richard C Dokken, San Ramon, CA (US); Gerald S. Chan, Saratoga, CA (US); John C Potter, Austin, TX (US); Alfred L Crouch, Cedar Park, TX (US)

(73) Assignee: Advantest (Singapore) Pte Ltd, Singapore (SG)

( * ) Notice: Subject to any disclaimer, the term of this patent is extended or adjusted under 35 U.S.C. 154(b) by 1035 days.

(21) Appl. No.: 11/682,314

(22) Filed: Mar. 6, 2007

(65) Prior Publication Data

US 2008/0091981 A1     Apr. 17, 2008

Related U.S. Application Data

(60) Provisional application No. 60/829,317, filed on Oct. 13, 2006.

(51) Int. Cl.
*G01R 31/3177* (2006.01)
*G01R 31/40* (2006.01)

(52) U.S. Cl.
USPC .............................. 714/726; 714/733; 716/103

(58) Field of Classification Search
None
See application file for complete search history.

(56) References Cited

U.S. PATENT DOCUMENTS

| | | | |
|---|---|---|---|
| 3,906,200 A | 9/1975 | Petschauer | |
| 4,839,745 A | 6/1989 | Tindall | |
| 5,444,716 A | 8/1995 | Jarwala et al. | |
| 5,488,615 A | 1/1996 | Kunoff et al. | |
| 5,570,376 A * | 10/1996 | Kunda et al. | 714/736 |
| 5,652,754 A | 7/1997 | Pizzica | |
| 5,812,561 A * | 9/1998 | Giles et al. | 714/726 |
| 6,381,710 B1 | 4/2002 | Kim | |
| 6,470,229 B1 * | 10/2002 | Wang et al. | 700/121 |
| 6,629,305 B2 * | 9/2003 | Ito et al. | 716/11 |
| 6,748,352 B1 * | 6/2004 | Yuen et al. | 703/16 |
| 6,830,957 B2 * | 12/2004 | Pu et al. | 438/108 |
| 6,886,140 B2 * | 4/2005 | Regnier | 716/1 |
| 7,080,283 B1 * | 7/2006 | Songer et al. | 714/30 |
| 7,146,584 B2 * | 12/2006 | Varney | 716/4 |
| 7,217,579 B2 * | 5/2007 | Ben-Porath et al. | 438/11 |

(Continued)

FOREIGN PATENT DOCUMENTS

| | | |
|---|---|---|
| JP | 02309431 | 12/1990 |
| JP | 2000304820 A * | 11/2000 |

OTHER PUBLICATIONS

"Secure Hash Standard", U.S. Department of Commerce, Technology Administratioin, National Institute of Standards and Technology, Federal Information Processing Standards Publication, Apr. 17, 1995, pp. 1-21.

(Continued)

*Primary Examiner* — Ajay Bhatia
*Assistant Examiner* — Dipakkumar Gandhi

(57) ABSTRACT

A process for improving design-limited yield by collecting test fail data, converting to electrical faults, and localizing to physical area on semiconductor die. The steps of identifying an area on a wafer containing a fault to enable the analysis of specific defects, accumulating data suitable for yield monitoring analysis based on pattern test failures logged on scan cells in scan chains on automatic test equipment, and translating scan cell and scan chain failure reports to geometric locations of electrical structures on wafers.

13 Claims, 12 Drawing Sheets

(56) References Cited

U.S. PATENT DOCUMENTS

| | | |
|---|---|---|
| 8,453,026 B2 | 5/2013 | Chan et al. |
| 2002/0073373 A1 | 6/2002 | Nakao et al. |
| 2003/0182552 A1 | 9/2003 | Tanimoto et al. |
| 2004/0015803 A1* | 1/2004 | Huang et al. ............ 716/10 |
| 2004/0049722 A1* | 3/2004 | Matsushita ............ 714/724 |
| 2004/0199573 A1 | 10/2004 | Schwartz et al. |
| 2005/0091621 A1* | 4/2005 | Goldberg et al. ............ 716/6 |
| 2006/0066339 A1 | 3/2006 | Rajski et al. |
| 2006/0104500 A1* | 5/2006 | Obara et al. ............ 382/145 |
| 2007/0038911 A1* | 2/2007 | Koenemann et al. ......... 714/732 |
| 2007/0179731 A1* | 8/2007 | Suri et al. ............ 702/117 |
| 2007/0220381 A1* | 9/2007 | Huang et al. ............ 714/724 |
| 2008/0092003 A1 | 4/2008 | Khoche et al. |

OTHER PUBLICATIONS

U.S. Appl. No. 60/829,317, filed Oct. 13, 2006, Richard C. Dokken, et al.

* cited by examiner

PROCESS FOR IMPROVING DESIGN-LIMITED YIELD BY LOCALIZING POTENTIAL FAULTS FROM PRODUCTION TEST DATA

CROSS-REFERENCE TO RELATED APPLICATIONS

The present application claims the benefit of priority under 35 USC .sctn. 119(e) from U.S. provisional patent application 60/829,317 filing date Oct. 13, 2006 first named inventor Dokken, titled: "A process for improving design limited quality by filtering production test data through a yield monitoring system to localize electrical faults on semiconductor wafers."

BACKGROUND

As manufacturing processes descend below 90 nm geometries, the well proven yield management system tools begin to lose effectiveness. In part, visibility of particulate defects is near the limit of optical inspection tools. Current yield management system tools discern correlations in areas of die which diverge from standard images. These tools cannot currently exploit understanding of the circuit functionality to geometrically locate divergences. There are also design-introduced electrical faults that are yield limiting at these tighter geometries which are detectable in the production test environment.

To improve the testability of high density semiconductor devices, modern design practice inserts additional circuitry specific to test such as scan chains. A scan chain in test mode is configured to be a very long shift register. Patterns generated to operate with scan chains do not have any functional utility and purely observe or control potential electrical defects. But scan chain and bit have little relationship to geometrical location of the defects.

Scan Basics

To explain the new process, it is first necessary to provide some background on established techniques of SCAN in semiconductor test. The approach of scan methodology is to replace all flip-flops in a design with scan flip-flops. Scan flip-flops provide two paths into each flip-flop: one for the mission of the design, and a second to facilitate test.

Scan Flip-Flops—There are two most common methods of implementation today:

MUXD—This scan flip-flop approach places a mux on the front end of the D-input. The selector to the mux, known as the scan enable, determines whether to use the mission mode input or the scan test input.

LSSD—Another common scan flip-flop approach is to use two clocks. One clock latches the mission path input into the flip-flop while the second clock latches the scan test input data into the flip-flop.

Scan Chains—By stitching all of the scan flip-flops, or scan cells, together into one or more scan chains, each flip-flop can be preset or observed. This allows for test patterns to be constructed that will concentrate on finding faults in mini sub-circuits. The first illustration FIG. 1 shows the circuit prior to scan insertion, and the second FIG. 2 shows the circuit after a MUXD scan insertion.

In FIG. 2, notice that each flip-flop has two input paths as controlled by a mux on the input. When the scan enable "SE" is asserted, the scan chain operates as a shift register. This allows for each flip-flop to be set to a specific state. It also allows for the observation of each flip-flop state as the values are shifted out of the device onto the scan output "SO". Each flip-flop, or scan cell is numbered for the purpose of referencing.

For this example, the 'and' gate can be tested by shifting data into scan cells 3 and 2. After the desired test condition has been loaded, the scan enable is de-asserted and a clock can be applied to capture the output of the combinational logic as observed at scan cell 1. The scan enable is once more applied and the result data as captured at scan cell 1 is shifted through the scan chain until it arrives on the device output for the scan chain.

Functional Tester Background

Historically, testers apply a set of simulated stimulus, and validate that the response on the device outputs match the results expected from the simulation. Functional testers are designed to report in a go/no-go fashion that all of the outputs matched the expected results for all checked strobe points or not. Functional testers are not architected to understand design criteria of the device under test such as the scan structures. Thus, while functional testers can understand which output signals contained failures, each output signal can represent tens of thousands of internal scan cells.

Another form of semiconductor testing uses optical scanning of wafers and comparison of the resultant images to identify variances from normal. These variances are reported as bounding boxes containing the geometric features that are found in some but not all wafer images. Yield management systems conduct pareto analysis to determine which defects have the greatest impact on yield and prioritize failure analysis. As processes approach and surpass 90 nanometer in feature size, optical scanning becomes less acute.

Thus it can be appreciated that what is needed is a capability to translate a scan cell pattern production test failure to an area on a wafer containing a fault.

SUMMARY OF THE INVENTION

The present invention is a computer-implemented method to determine the physical die location of electrically failing circuit structures by combining ate fail output with layout information. The tangible useful result of this diagnostic process yields a list of circuit structure locations containing the faults causing a test pattern to fail. Due to the shrinking geometries and the process maturity, the diagnostic process does not stop here. The circuit structure locations are further reduced to specific geometric coordinates on the die for understanding by failure analysis engineers.

To report the geometric location of an electrically detected failure recorded on an automatic test equipment (ate) apparatus to a computer-implemented yield management utility software program product the invention has the following steps:

reporting a failure type as measured by an automatic test equipment apparatus, wherein failure type, in an embodiment, comprises one of the group consisting of "unclassified", "RAW STUCK", "UNRESOLVED BROKEN CHAIN", "RESOLVED BROKEN CHAIN", "RAW DELAY", "PATH DELAY", and "other";

translating a failure location from scan chain-bit position to a logical design name for a scan cell;

in one embodiment of the invention, tracing the components driven by the output of a scan cell;

in a second embodiment of the invention, tracing the components driving the input of the scan cell;

in a third embodiment of the invention, tracing the components and wires directly connected to a port on a component;

reading a list of origins and dimensions of components and wires connecting said components; and computing a bounding box, wherein a bounding box comprises the maximum value and the minimum value of coordinates containing the origin and dimensions of a scan cell, at least one traced component and at least one wire connecting said traced component to the scan cell.

Yield Improvement Test Flow Methods

The present invention comprises some of the following processes: recording of automatic test equipment (ate) test failure information into a geometric database using novel and efficient compression steps which increase information, reduce storage requirements, and facilitate quicker retrieval; identifying failing scan cells in distinct name spaces used for test, logical design, and physical layout; reporting and displaying of an area on a wafer containing a fault. See FIG. 4

DETAILED DESCRIPTION

Failure Type Classification

Semiconductor test programs are typically organized such that scan tests are divided into three areas: Chain Integrity Tests, Stuck-At Tests, and AC-Scan tests. Chain Integrity Tests validate that the scan chains are operational and can be used by the Stuck-At and AC-Scan Tests to check logic. The Stuck-At Tests validate that all logic paths are operational and are not stuck to either a high or low state. The AC-Scan Tests validate that logic paths can be transitioned in suitable time to meet the mission of the device design.

Figure 1:
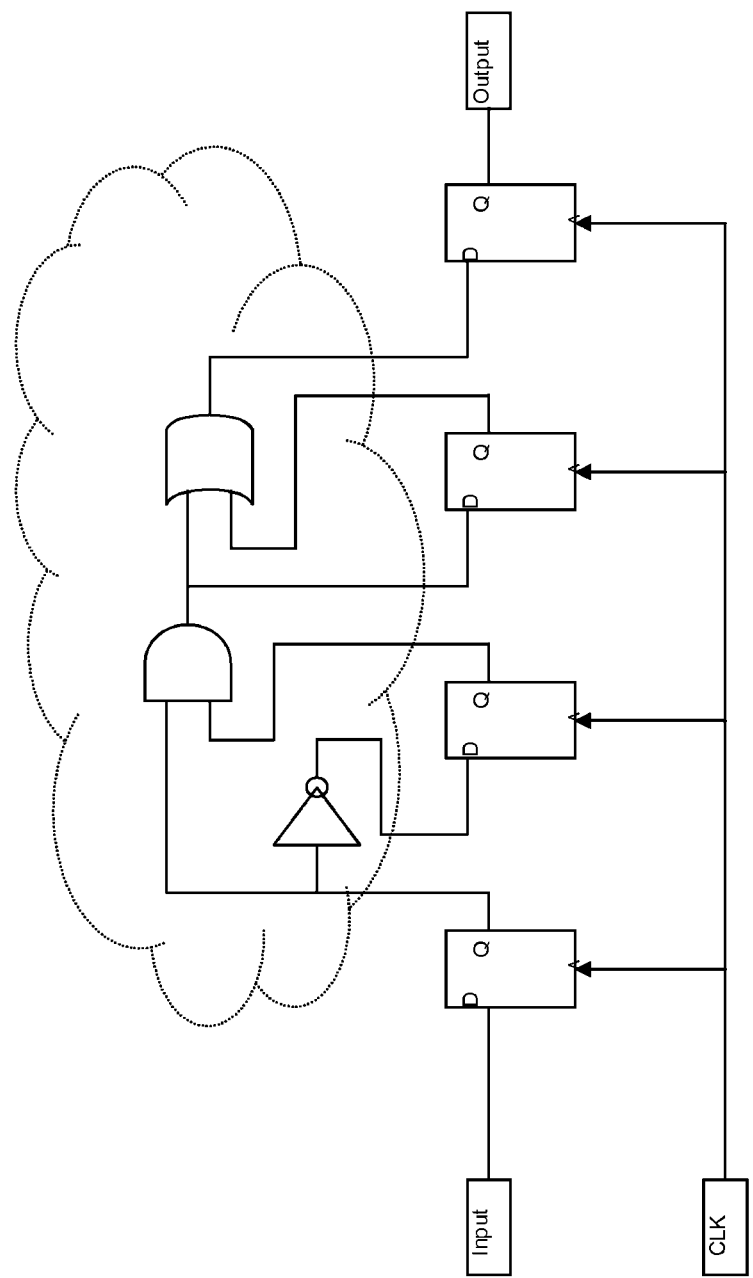
FIG. 1. Logic Circuit Prior to Scan Insertion
FIG. 2. Logic Circuit After Scan Insertion
FIG. 3. Scan Chain Test
FIG. 4. Information Flowchart
FIG. 5. Flowchart for Classifying Failure Type
FIG. 6. Schematic showing an example circuit
FIG. 7. Schematic showing sample result of a FanIn Trace
FIG. 8. Schematic showing sample result of a FanOut Trace.
Figure 2:
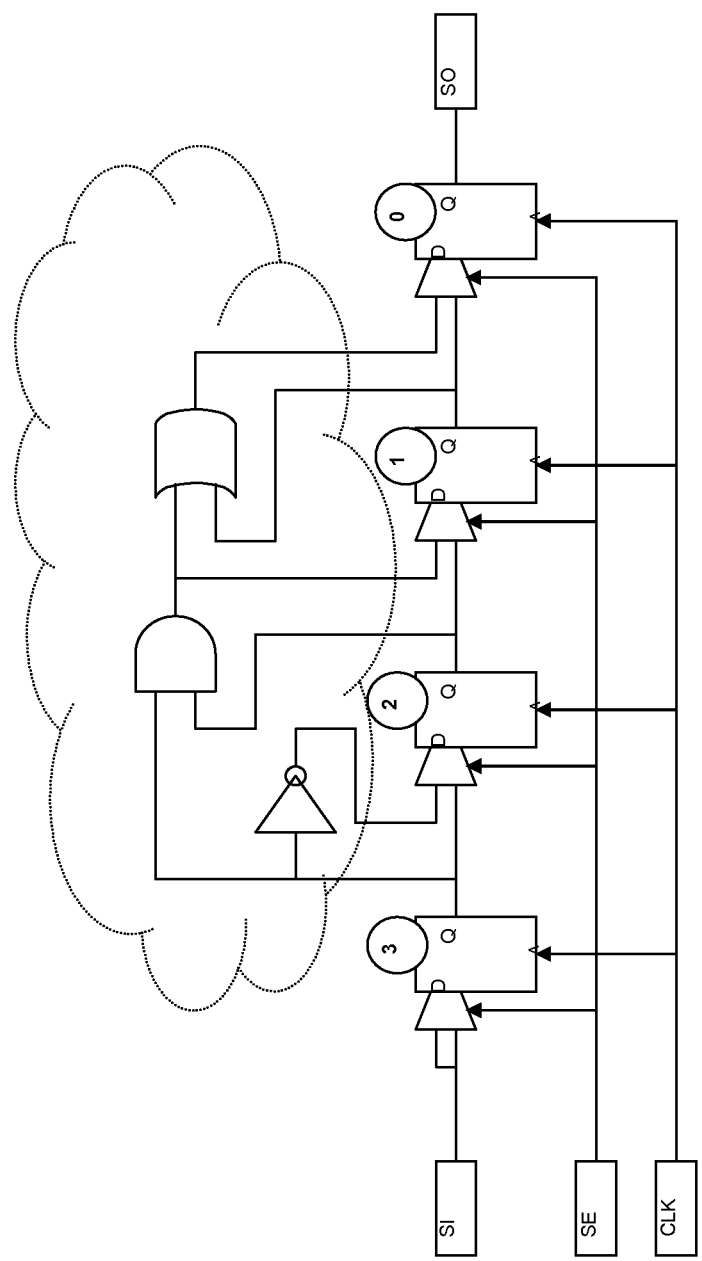
Figure 3:
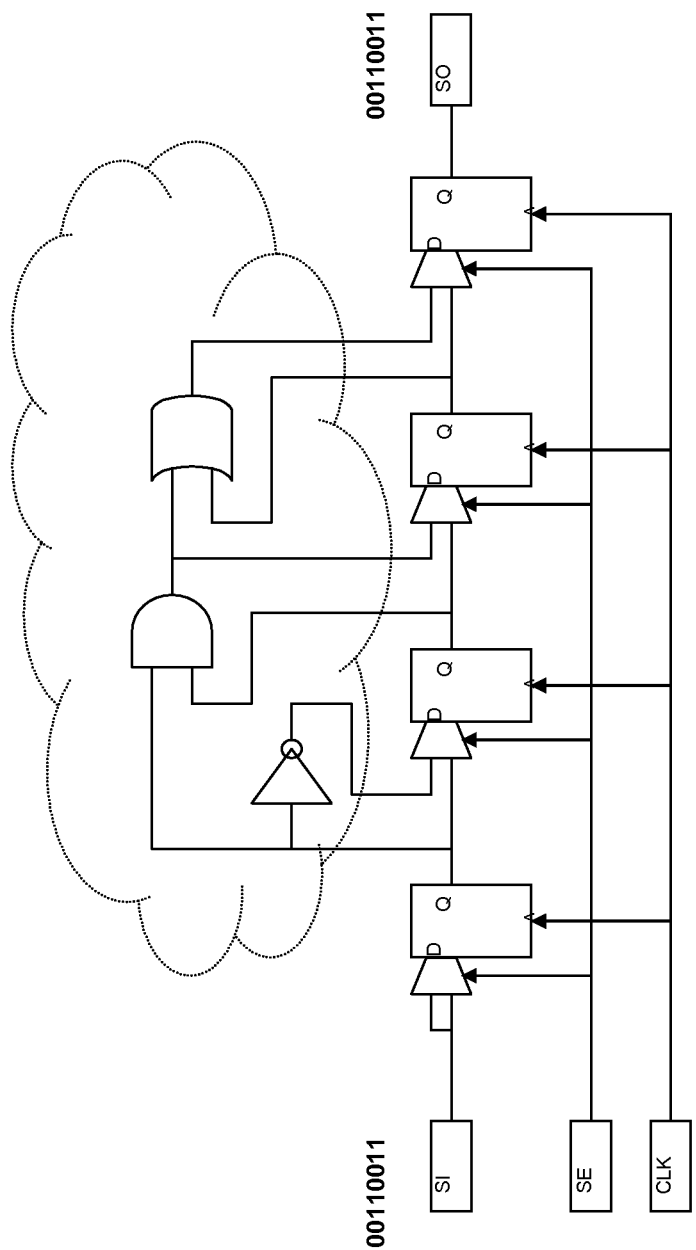
Figure 4:
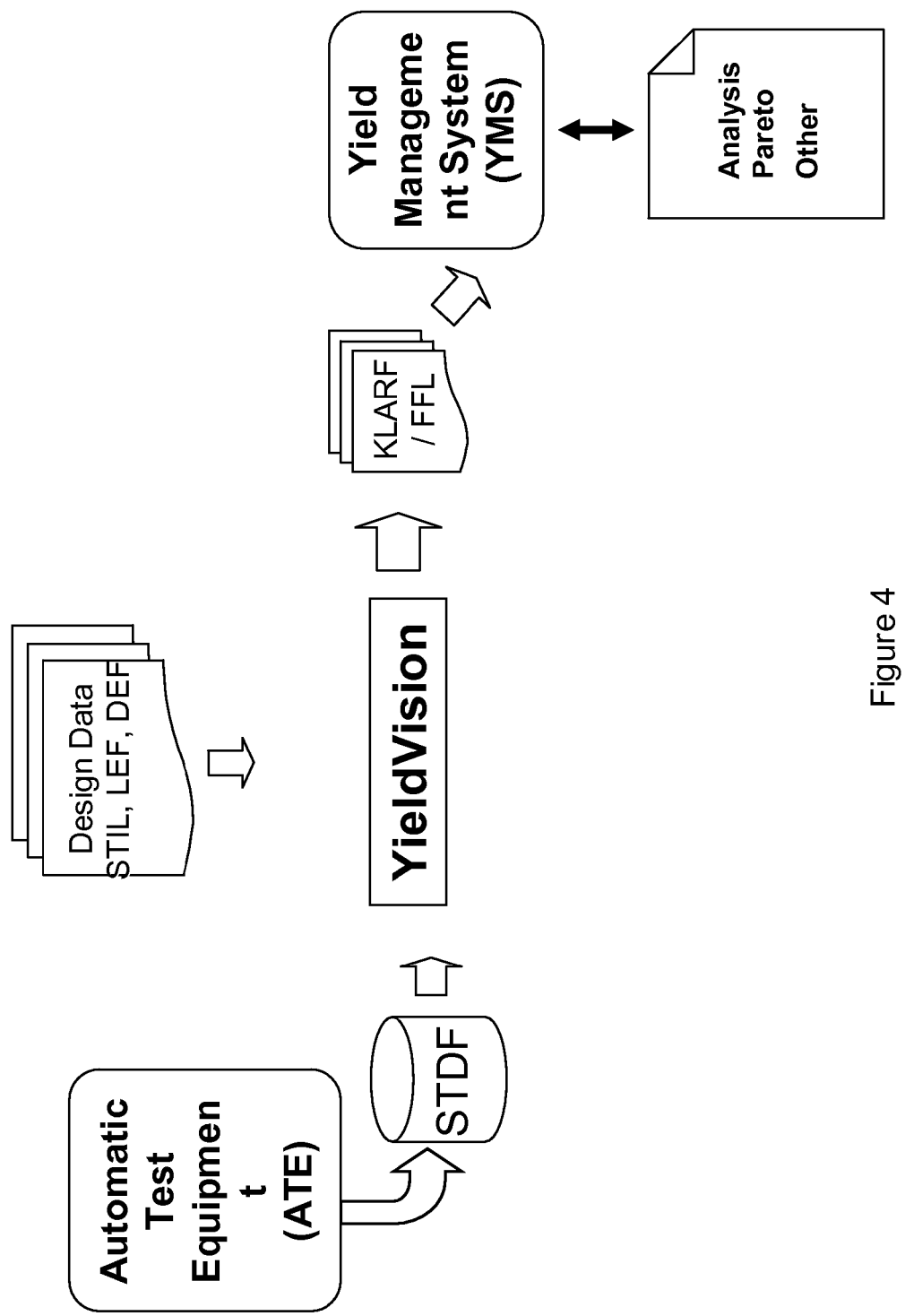
Figure 5:
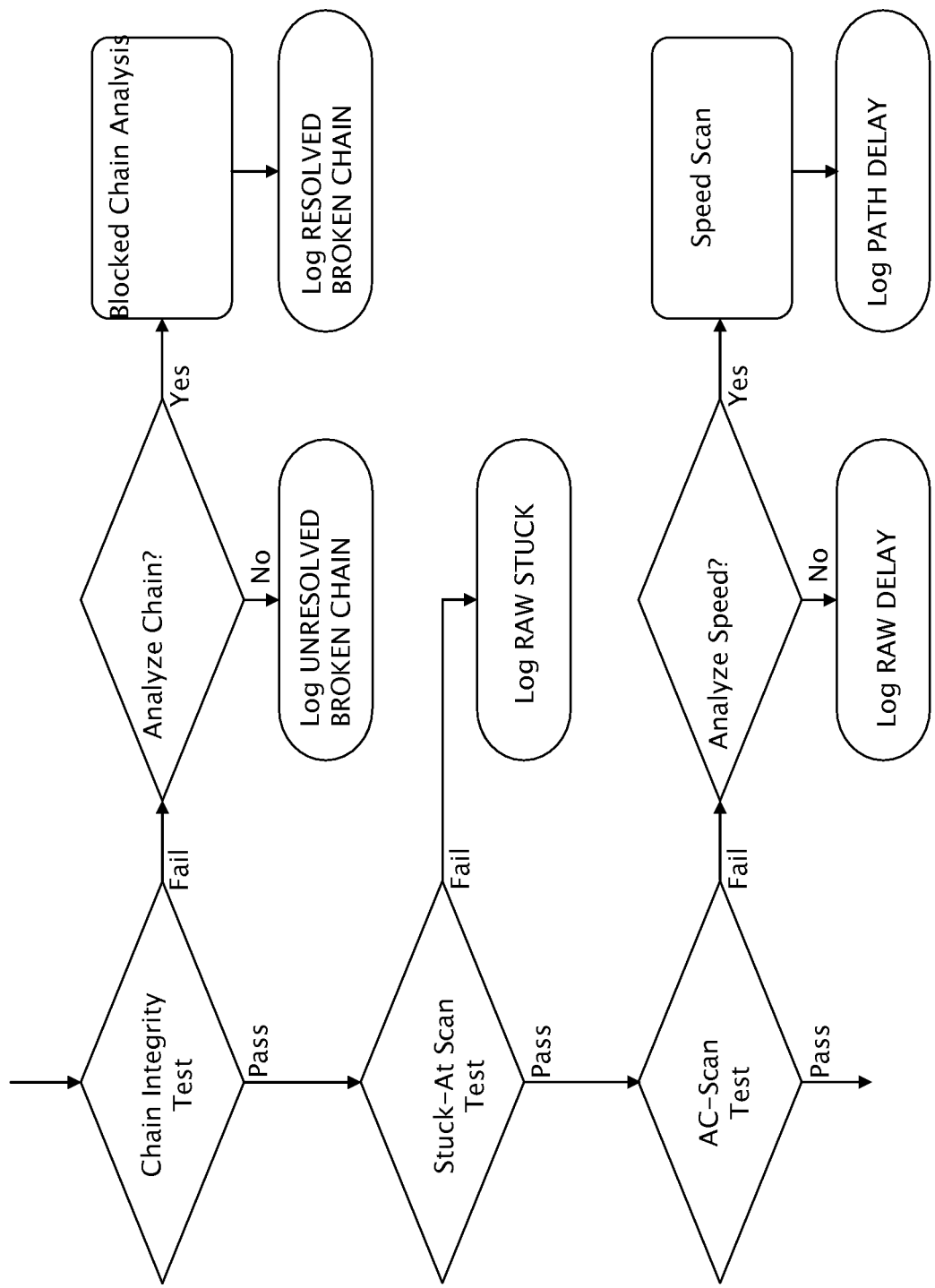
Figure 6:
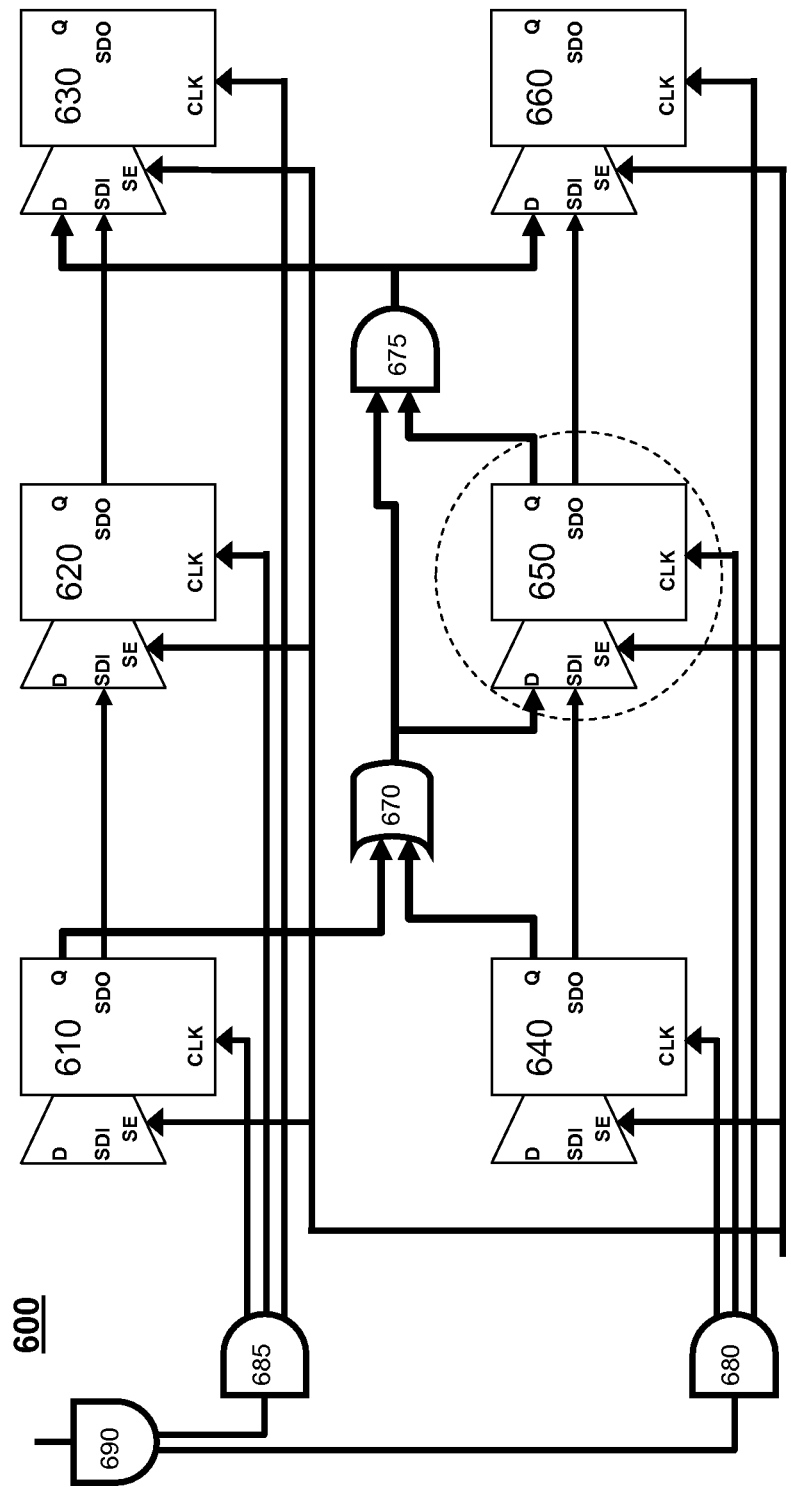

The flow chart in FIG. 5 shows such an organization and categorizes the failures from these three outputs as UNRESOLVED BROKEN CHAIN, RAW STUCK, and RAW DELAY.

The flow chart adds a decision after Chain Integrity Test failures: Analyze Chain? If this decision is true, the Blocked Chain Analysis process will be invoked to find the position in the scan chain where the block occurs. If the chain break position is found, the failures can be categorized as RESOLVED BROKEN CHAIN.

The flow chart adds a decision after AC-Scan Test failures: Analyze Speed? If this decision is true, the SpeedScan process will be invoked to find path delay values. Once the failing paths are measured, the failures can be logged as PATH DELAY.

Defect Location

Since available data files do not identify the potential defect locations clearly, the invention comprises a process to create a useful database consisting of the following computer implemented methods:

parsing at least one LEF file and parsing at least one DEF file, comprising the steps of
1. merging a plurality of DEF files;
2. concatenating hierarchy names;
3. recalculating XY coordinates;
4. recalculating orientation facings; and
5. merging nets;

and
storing the component names of the design and their ports in a query-able form.

Parsing

Multiple Name Space Resolution and Navigation

In order to pinpoint the region on a die where a circuit structure exists, it is necessary to traverse the relationship between the implemented component list and the physical dimensions of the die. This relationship is found in the combination of DEF and LEF files. These file formats are defacto standards generally known and used by those skilled in the arts of semiconductor equipment manufacturing and electronic design automation software development. In practice this approach is too slow to be economically useful. An embodiment of the present invention uses a special built data structure.

Parsing the LEF Files

Tracing the layout efficiently becomes feasible by first converting the library information into a query-able format. A process technology for a chip may have on or more LEF files. Information such as MACRO size, port location, and port direction can be found in this file system. In addition, via descriptions can also be found in the LEF files.

Parsing the DEF Files

The next step in enabling trace operations of a circuit from layout data is to convert the DEF files into a query-able format. There may be one or more DEF files that describe the chip. If more than one DEF file is needed to describe the chip, a relationship must be identified between the MACRO name and the name of the DEF file that it is associated. The present DEF file syntax does not provide a way to communicate this relationship. Once the MACRO to DEF file relationships have been learned, the DEF files must be merged to together. For simplicity, each MACRO to DEF relationship defines a DEF module.

The process of parsing the LEF and DEF files, comprises the methods following: Merging DEF Files, Concatenating Hierarchy, Recalculating XY Coordinates, Recalculating Orientation Facings, and Merging Nets.

Merging DEF Files

Several pieces of information must be managed when merging 2 or more DEF files together. The process of merging DEF files consists of a recursive method which begins at the top DEF module. The process takes the learned list of DEF modules and compares the list against component MACRO names found in the DEF file. When a DEF module is encountered, the DEF module is then converted into a database format. This process continues recursively until there are no other DEF modules being instantiated at the leaf boundary. All DEF blocks and statements are stored in the database. Once the last leaf DEF module has been processed, the parent DEF module entries are then revised with the child DEF module expanded.

The integration of the child module into its parent module takes place in the form of several processing steps. These steps include concatenating component hierarchy names between parent and child module recalculating child component XY placement coordinate with respect to the parent modules origin recalculation of the child component orientation facing with respect to the target orientation facing of the parent module concatenating net route connection lists recalculation of child net route coordinates with respect to the parent module augmentation of the via description list with new via descriptions that were used in the net routing of the child module Concatenating Hierarchy In order to reflect the full netlist hierarchy as it was intended by the original Verilog or VHDL netlist, MACRO instance names that are found in the COMPONENTS section of the DEF are concatenated together. However, the resultant name could be encoded to either shrink the size of the stored database or to provide a level of security against the interpretation of circuit intent (i.e., IP protection)

In addition to updating the instance name in the COMPONENTS section of the DEF, the instance names found in the connection lists of the NETS and SPECIALNETS sections must also be modified.

Recalculating XY Coordinates

The ultimate goal of XY coordinate recalculation is to understand an entity's placement with respect to the origin of the complete die boundary. The die boundary is given in the top DEF module as the DIEAREA statement. The entities in a DEF file that have XY coordinates are components, nets, specialnets, vias, and obstructions.

In order to recalculate the XY coordinates associated with each of those entities, XY coordinate transform equations were developed. Inputs to these equations are Placement coordinate of the child module in the parent module Placement orientation facing of the child module in the parent module The DIEAREA of the child module XY coordinate of the child entity Using combinations of these four inputs, XY coordinate transform equations were developed by targeting entity types. For example, a transform equation which targets COMPONENTS is not necessarily the same equation for NETS.

Recalculating Orientation Facings

In order to get the correct orientation facing, conversion tables use the current child component orientation and the child DEF module orientation target as lookup indexes with the conversion output being the orientation with respect to the parent module. Thus, the orientation conversion table consists of 64 possible index combinations where each index can be one of the following eight orientation facings:

N North
E East
S South
W West
FN Flipped North
FE Flipped East
FS Flipped South
FW Flipped West Merging Nets In general, nets names live a double life. On one hand, a net name can be obfuscated like "W21" and on the other hand, the net name could be self-documenting such as "CLK2_net". When it comes to merging a child DEF module with a parent DEF module, an issue arises where two nets meet at a module boundary. To get around this issue, a merging process monitors the port directions on the net. The name of the net chosen depends on the origination of the port driving the net.

If the port driving the net originates from the parent module, then the net name of the parent is used and the connection list of the child module is appended to the parent's connection list. The same is said of the XY coordinate list and via content of the route. If the port driving the net originates from within the child module, then the result of concatenating the hierarchical path to the child module and the net name of the child is used as the new net name. The new net name is stored in the parent modules database. The parent port connection list is concatenated with the child nets connection list and is associated with the new net name. Likewise, the XY net coordinate and via content in the original parent net entry are concatenated with the child net XY coordinates and via content. After the parent net information has been merged with the child net information, the original parent net entry in the parent database is deleted. The XY coordinate data of the child nets are recalculated during the merge operation.

Storing

Content

Each major syntax block (NETS, COMPONENTS, SPECIALNETS, MACRO, etc.) that is contained in any LEF file and/or any DEF file comprises specific block type entry statements. These statements are stored in a key-value context by using the item name as the key and the LEF or DEF description statement as the value.

Various pieces of information about items at an instance name level are stored by the present invention. The keys that are stored comprise:

Port instance name
Net instance name
Component instance name
MACRO name (a.k.a., model name, module name, etc.)
VIA name
MACRO names that have been used as ScanCells Values to the above keys are comprise one of a key to other database and a full content description of a DEF or LEF entry.

Store Process

Various cross reference relationships are created throughout several associative arrays (key-value) database files. At least one of the database files created is a multi-dimensional database which enables an optimized multi-dimensional query of the LEF MACROs, PIN names, and I/O direction.

Other storage architecture enhancements include content encryption and/or content compression.

Optimizations of the Invention

The present embodiment of the invention is creating queryable relationships across several database files. This manages the volume of information contained in the layout files. An embodiment of the storage architecture reduces and/or eliminate content duplication across the overall database structure.

Automatic trace control (scancell macro, PI/PO, and blackbox) is controlled in-part by the method of caching macro names that have been used as a ScanCell. The combination of ScanCell name matching and DEF component name to MACRO relationship mapping enables a third, much smaller database to be created (at compile time) which only contains scancell MACRO names. This creates a far faster lookup process than sifting through potentially hundreds of thousands of scancell names.

Since the instance names of nets, ports, and components are manipulated to use normalized hierarchy separators at compile time, this enables faster hierarchy dissection during trace operations.

The method of storing the full DEF or LEF description of major statement entries intact in particular database structures optimizes the assembly process of mini-DEF and mini-LEF for SPLAT representation.

The method of storing the component names and their ports in a query-able form comprises the steps of storing the full DEF or LEF description of major statement entries intact, manipulating the instance names of nets, ports, and components to use normalized hierarchy separators at compile time, caching macro names as a scancell, matching scancell names, and mapping DEF component names to MACRO names. This provides the present invention a platform across multiple name spaces resolving the differences between files created for unique applications and enabling simplified access from failing scan cells identified in the test name space to the wires and components attached to them in the physical or fabrication name space.

The Trace Engine

The Trace Engine is an optimized system for gathering circuit structures from a device design focused on electrical faults. The Trace Engine extracts design and layout information from STIL, LEF, and DEF files which are de jure and de facto industry standards.

Methods

The Methods (Processes) used to gather pertinent circuit structures are: Fan-In, Fan-Out, Net-Print, and Tree-Trace.

Fan-In Objective

When a scan test (stuck-at or ac) fails, the information reported at the tester is typically in pin and cycle-count. Once this pin and cycle-count data is converted into scan chain and bit position (scancell), the list of failing scancells can be fed into the Trace Engine using the Fan-In Method starting at the D-Input to the failing scancell(s). The Trace Engine will return only the circuit structures in layout format that lead into the failing scancell. The electrical fault likely exists within this small set of circuit structures.

Fan-Out Objective

When a scan chain is blocked, and if the test equipment can identify the scancell where the blockage occurs, the failing scancell for each blockage can be fed into the Trace Engine using the Fan-Out Method starting at the Scan-Output from the failing scancell(s). The Trace Engine will return only the circuit structures in layout format between this scancell and the next stage in the scan chain.

Net-Print Objective

When a diagnosis of failing scan data is performed and returns a fault candidate in the form of component and port, the component and port can be fed into the Trace Engine using the Net-Print Method starting at the component and port. The Trace Engine will return only the circuit structures in layout format of the net associated with the component and port.

Tree-Trace Objective

When an AC, scan-shift verification or delay-based scan test fails, and if the problem is identified to be related to the clock delivery, reset or the power system, then the Tree-Trace method can be used to localize some portion of the wide-fanin/fanout buffered tree-structures that connect to the clock, reset, or power-ground ports of the identified failing scancells. The Trace-Engine will return only the circuit structures involved with the widely-distributed net that are between the failing scancell and the drive scancells, or that are common to the multiple identified failing scancells.

Method Optimizations

Gathering of data for the purpose of yield analysis means that data will be collected in a production environment. Any significant decrease in production throughput will reduce the benefits of potential yield improvement. Thus, a critical component of the invention is the focus on optimization.

Buffer Level Limitation Optimization

By allowing a user-definable buffer level limit for the Trace Engine, tradeoffs between circuit detail and throughput can be made On-Demand Execution Optimization Once a specific trace operation is performed for a design, that trace is remembered in a history. Thus, subsequently encountered failures that make a repeated trace request will not pay the penalty of the repeating the trace. So, the size of the database can be limited to only the trace operations where failures have occurred while optimizing throughput to only perform each requested trace operation once.

Focus of Circuit Structure Optimization

While the Trace Engine output identifies a region of the die that contains many other circuit structures, such as other wire routes, vias, gates, etc., the Trace Engine is focused to only output the circuit structures that can be related to the fault.

Geometric Location of Failure Incidence

All trace operations begin with a port name. Two ways to get the port name are.

The port name is given explicitly as the port of a gate, register or primary input/output The component instance name is given and the port names are discovered from the LEF and DEF information gathered.

A port that is connected in the circuit has only one net connection. But, a net can have two or more port connections. Knowing this basic premise allows basic trace operations to occur.

All trace operations can keep a running list of statistics about the trace result. Examples include but are not limited to:

Port density
Via density
Logic Level depth
Component density
Via types used
Net use types
LEF Macros used
Metal layers used The result of the trace operations may be controlled by learning a trace control point list, defining filters or defining limit governors.

Fanin Process

The Fanin trace operation is a recursive process. Given an input port or inout port, a Fanin operation comprises the following steps:

Discover the component name that the port belongs to and compare it to the components in the component trace cache. If a match is found, stop tracing this branch and continue tracing any unresolved branches. If no match found, add component name to the component trace cache.

Find the net connected to the input port

Look for output port(s) or inout port(s) connected to the net. If more than one output port exists, issue warnings because this is a potential bus contention mechanism which may cause a device to fail.

Check to see if the component instance name associated with the output port found in step 2 or the output port itself is part of a trace filter. If yes, perform filter dependent actions. If no, continue Check to see if the component instance MACRO name is part of a trace control list. If yes, stop tracing this branch. If no, continue.

Using the LEF database, discover the input ports on the component that belongs to the output port found on the net.

For each input port found in step 5, repeat steps 1 through 4 until all trace control points have been identified and/or until filter actions have been performed.

Figure 7:
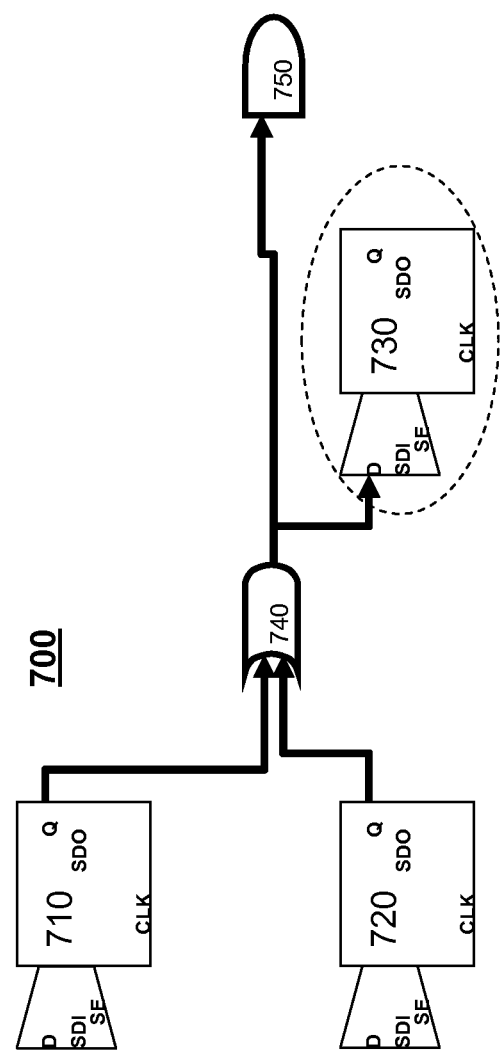

FIG. 7 shows an example of a Fanin trace operation result. This figure shows the Fanin operation with respect to the D input of a flipflop. The trace stops at control points—scancells, blackboxes, and primary I/Os.

FanOut Process

The FanOut trace operation also is a recursive process. Given an output port or inout port, a FanOut operation comprises the following steps:

Discover the component name that the port belongs to and compare it to the components in the component trace cache. If a match is found, stop tracing this branch and continue tracing any unresolved branches. If no match found, add component name to the component trace cache.

Find the net connected to the output port

Look for input port(s) or inout port(s) connected to the net.

For each input port found in step 3, check to see if the component instance name associated with the input port or the input port itself is part of a trace filter. If yes, perform filter dependent actions. If no, continue Check to see if the component instance MACRO name is part of a trace control list. If yes, stop tracing this branch. If no, continue.

Using the LEF database, discover the output ports on the component that belongs to the input port that is being processed in step 4.

For each output port found in step 6, repeat steps 1 through 5 until all trace control points have been identified and/or until filter actions have been performed.

Figure 8:
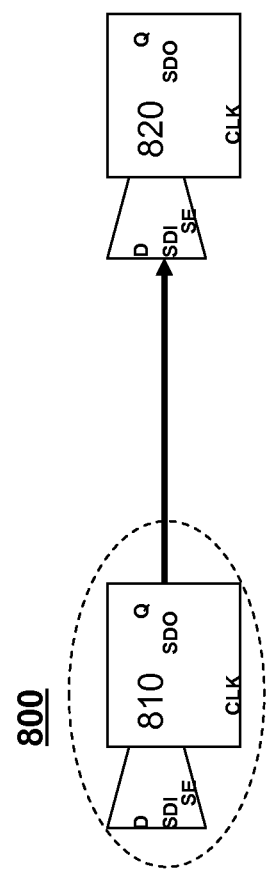

FIG. 8 shows an example of a FanOut trace operation result. This figure shows the FanOut with respect to the Q output of a flipflop. The trace operation stops at scancells, blackboxes, and primary I/Os.

NetPrint Process

Figure 9:
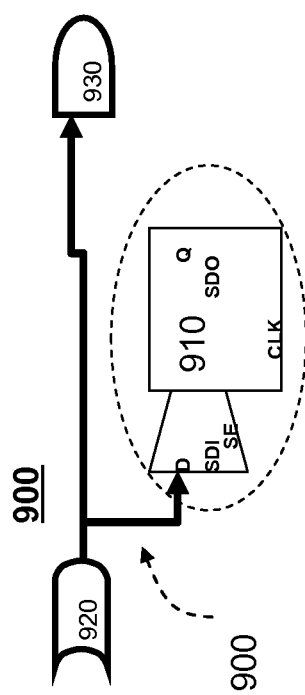
FIG. 9. Schematic showing result of a NetPrint Trace
FIG. 10 Schematic showing result of Tree-Trace
FIG. 11 Schematic showing result of Tree-Trace
FIG. 12. Physical location of Fan-In Trace result

This is a fundamental and essential operation. NetPrint looks up the port name and finds the name of the net attached to it. The net name is used as a lookup index in the database to retrieve the route XY coordinates, vias, and component port connection list. FIG. 9 shows an example of a NetPrint trace operation result. The figure shows a net and the components connected to the net with respect to the D input of a flip-flop.

Figure 10:
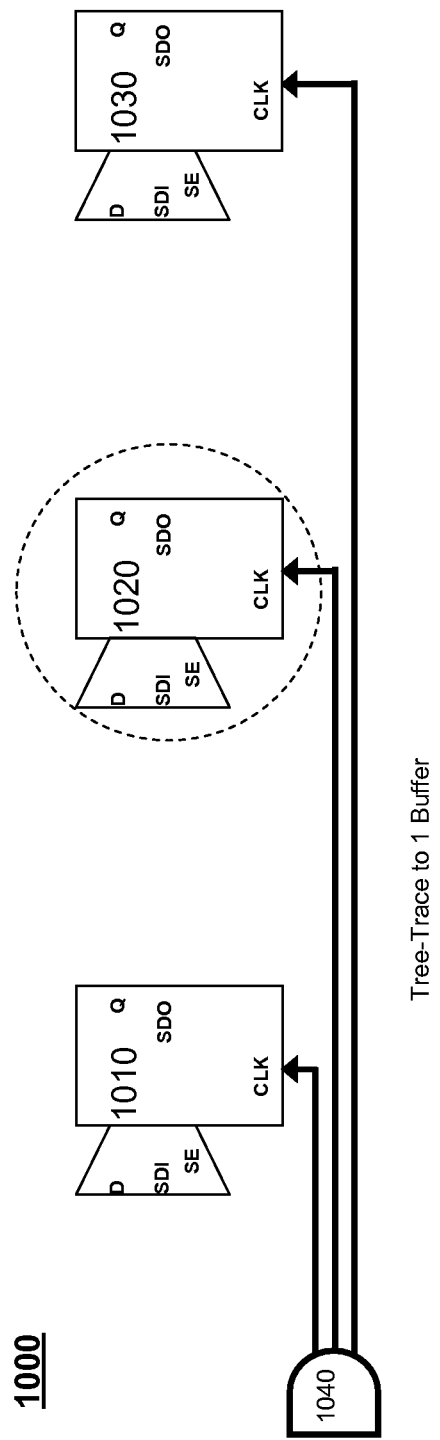
Figure 11:
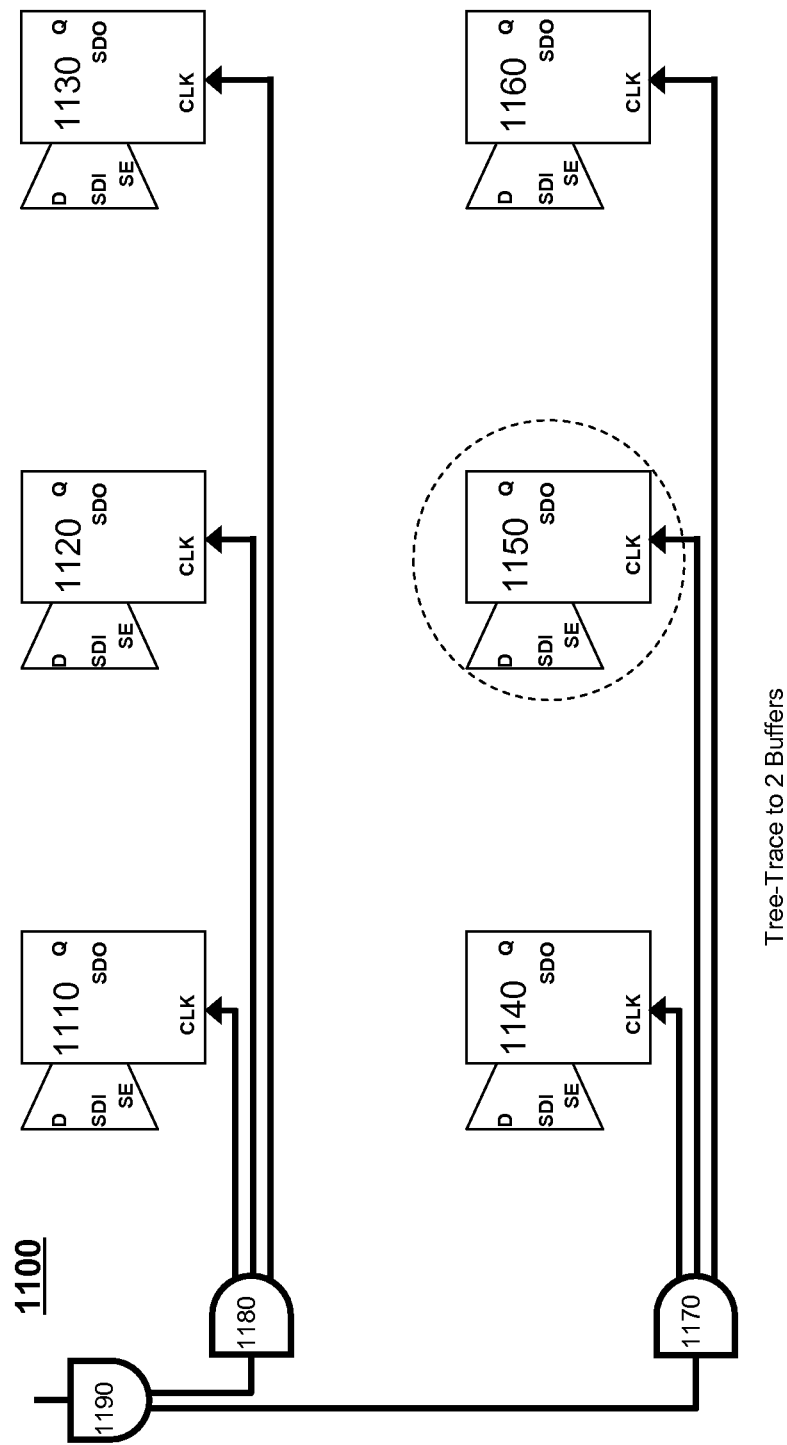

Tree Trace Process (FIGS. 10 and 11)

A method comprising the following steps:

Identifying a starting scancell,

Tracing the clock input back to the output of the first buffer,

Tracing the output of said buffer to all components touched by this output,

Repeating for a user defined number of buffer levels, and

Filtering the returned elements for commonality amongst failing scancells.

Trace Control—The trace engine has methods to control the trace operation:

setting limits for the trace activity, modifying the result of the trace, normalizing hierarchy symbols, and matching deviant hierarchy names.

Trace Control Points

The trace control point is what could be called a first level control mechanism. Basically, any primary I/O, any macro that has been used as a scan cell, and any blackbox modules. The primary I/O is learned from the PINS sections of the top level DEF file. The scan cells macros are learned from interrogating the ScanChain descriptions from an Automatic Test Pattern Generation (ATPG) tool or other sources.

Blackbox modules, in some cases, are inferred and in other cases require some form of user guidance either in the form of blackbox candidate specifications for LEF MACROS or by identifying either the blackbox instance name or the name of it's instantiated MACRO.

Trace Limit Governors

Level 2 controls set limits for the trace activity to stop. Examples of this are logic level depth, the number of ports accumulated during the trace operation, the number of nets, the number of components, and the list goes on.

Trace Control Filters

Level 3 controls specifications to modify the result of the trace in some way. An example of this would be to list in sorted order the nets by the number of vias contained in the net. Or, report the trace results only if metal 7 layer is used in the net connections.

Netlist Circuit Structure

When a circuit is designed, the netlist is typically developed in a modular fashion. Basic circuit modules are instantiated to create a bigger module. These modules are, in turn, used to create even bigger modules until the entire chip has defined. To identify a port on a basic module, one would describe the absolute hierarchy path to the port. The problem with electronic design automation (EDA) tools is that they do not all use the same hierarchy delimiter symbols. An test tool which operated on only the Verilog netlist may describe the port to a flip flop as "\top.core.reg1.A" and the layout tool for the same circuit may describe the same circuit location as "/top/core/reg1/A". Still, a second test tool may describe the very same port location as "/core\.reg1.A".

In order to correlate observation point failures of a test pattern to the physical space, the circuit representation that was used in the creation of the test pattern must be correlated to the component list description found in the DEF file(s). For this to occur, the hierarchical name representation must be normalized to use a common hierarchy delimiter symbol. Once the component names are in a common delimited format, then hierarchy matching methods can be applied to locate Normalizing Hierarchy Symbols To normalize the hierarchy symbols of the hierarchical reference to a component or a port name, a computer-implemented process picks apart the hierarchy name based on typical hierarchy delimiter symbol combinations and then re-assemble the hierarchy name with a default hierarchy delimiter symbol. Examples of a default hierarchy delimiter would be a period '.' or a forward slash '/'.

Matching Deviant Hierarchy Names

As mentioned above, hierarchy names to a port or component may vary from one EDA tool to another. In order to compare circuit attributes from one EDA tool to the circuit attributes given by another tool, a hierarchy match process must take place. As an example, assume that a test tool has referenced a scancell as "/Level0/Level1/Level2/d1". The "d1" is actually a port name. Now, assume that the component name in a DEF file for that same circuit is represented like this "/Level1/Level2".

The first observation of the example above is that a direct lookup of the scan cell name in the DEF database will yield no positive match. It is for this reason, the following computer-implemented method was developed.

To find a name match, perform the following steps:

1. Converting all component names in the DEF database to use a normalized hierarchy delimiter symbol.

2. Converting all ScanCell name to use the same normalized hierarchy delimiter symbol that was chosen in step 1.

3. Dissecting the ScanCell name into it's hierarchy levels. The ScanCell name will consist of N levels. Level 0 of the is on the far left and Level N is on the far right.
4. Setting index j=0 and index K=N.
5. Computing if the ScanCell name matches any of the component names of the DEF database? If yes, a match has been found and the matching process is finished. If no, proceed to step 6.
6. Removing hierarchy Level K of the ScanCell name. If this action removes the hierarchy Level J, go to step 9. Else, go to step 7.
7. Computing if the ScanCell name match any of the component names of the DEF database? If yes, a match has been found and the matching process is finished. If no, proceed to step 8
8. Decrementing index K by 1. Go to step 6.
9. Removing Level J from the ScanCell name.
10. Incrementing index J by 1. Set index K=N.
11. If J<=N, then going to step 5. If J==N+1, then no match has been found and ending name matching process.

CONCLUSION

Figure 12:
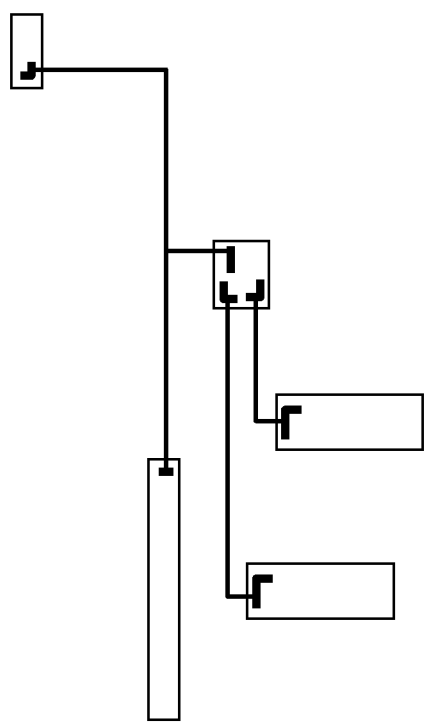

The present invention is a method for determining an area on a wafer containing a fault. A test pattern failure, observed on automatic test equipment, creates a data log of failing output from the pattern. A series of transformation steps converts each failure to its corresponding test scan cell and thence to an instance of a physical component on a die on a wafer. Electrically, a number of wires and vias spanning multiple metal layers and components are implicated by the failing scan cell. The present invention computes a bounding box containing these failing circuit structures suitable for analysis by yield management systems. FIG. 12 shows bounding boxes localizing potential fault locations.

As each scan cell may be tested tens of thousands of times, and fail a substantial number of them this process effects significant data reduction by computing one bounding box for each failing scan cell rather than each test failure.

As manufacturing processes increase potential productivity, new processes are needed to address sources of faults which threaten to reduce yield. While visibility of particulate defects is near the limit of optical inspection tools, design-introduced electrical faults which are yield limiting at these tighter geometries begin to be significant. The present invention efficiently augments manufacturing test procedures to enable the economic analysis of electrical faults and organizes geometric information of components in a database appropriate to production test volumes and speeds. A substantial economic benefit may result from identifying causes for low yield in semiconductor manufacturing early in the product life cycle of a new process to reduce costs and improve profit.

The scope of the invention should be determined by the appended claims and their legal equivalents, rather than the examples given to provide illustrations of presently preferred embodiments.

What is claimed is:

1. A method for reporting a physical area containing an electrically detected fault in a scan chain bit position recorded on semiconductor test equipment apparatus to a computer-implemented yield management utility software program product comprising the following steps:
   localizing the electrically detected fault in the scan chain bit position to within a detailed physical circuit description;
   tracing circuit structures that are connected to a scan cell with which the electrically detected fault in the scan chain bit position is associated; and
   in response to the tracing, determining and exporting X/Y Die Coordinate on Wafer, X/Y Origin on Die, X size, Y size, Area (X*Y) and Classification of potential sources of the electrically detected fault in the scan chain bit position.

2. A computer-implemented method, comprising:
   translating a fault location in a circuit from i) a scan chain bit position, to ii) a name of a scan cell in a logical design;
   using the name of the scan cell to execute a trace of circuit structures that are connected to the scan cell, thereby identifying circuit structures that are potential sources of faults in the circuit; and
   reporting physical locations of the circuit structures.

3. The computer-implemented method of claim 2, wherein reporting the physical locations of the circuit structures comprises:
   displaying the physical locations of the circuit structures.

4. The computer-implemented method of claim 2, wherein reporting physical locations of the circuit structures comprises:
   computing a bounding box having minimum and maximum coordinate values of the physical locations of the circuit structures.

5. The computer-implemented method of claim 2, wherein the reported physical locations are locations on a die.

6. The computer-implemented method of claim 2, wherein the reported physical locations are locations on a wafer.

7. The computer-implemented method of claim 2, wherein using the name of the scan cell to execute a trace of circuit structures that are connected to the scan cell comprises:
   executing a trace of circuit structures that fan-in to the scan cell.

8. The computer-implemented method of claim 2, wherein using the name of the scan cell to execute a trace of circuit structures that are connected to the scan cell comprises:
   executing a trace of circuit structures that fan-out of the scan cell.

9. The computer-implemented method of claim 2, wherein using the name of the scan cell to execute a trace of circuit structures that are connected to the scan cell comprises:
   executing a tree-trace of clock delivery circuit structures for the scan cell.

10. The computer-implemented method of claim 2, further comprising:
    saving information on each executed trace;
    repeating said method for a same or different fault location; and
    during said repeating of the method, checking for saved information on an executed trace, and using the saved information in lieu of re-executing a trace.

11. The computer-implemented method of claim 2, further comprising:
    determining a class of fault corresponding to the fault location; and
    using the name of the scan cell to execute a particular type of trace of circuit structures, the particular type of trace being based on the class of fault.

12. The computer-implemented method of claim 2, further comprising:
    setting limits on the circuit structures identified by the trace.

13. The computer-implemented method of claim 2, wherein using the name of the scan cell to execute a trace of circuit structures that are connected to the scan cell comprises:

parsing at least one LEF file and at least one DEF file.

\* \* \* \* \*